(12) United States Patent
Park

(10) Patent No.: US 9,699,900 B2
(45) Date of Patent: Jul. 4, 2017

(54) PRINTED CIRCUIT BOARD AND DISPLAY DEVICE HAVING THE SAME

(71) Applicant: SAMSUNG DISPLAY CO., LTD., Yongin, Gyeonggi-Do (KR)

(72) Inventor: Moon Chul Park, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 114 days.

(21) Appl. No.: 14/680,274

(22) Filed: Apr. 7, 2015

(65) Prior Publication Data

US 2016/0143159 A1    May 19, 2016

(30) Foreign Application Priority Data

Nov. 19, 2014    (KR) .................. 10-2014-0161647

(51) Int. Cl.
| | | |
|---|---|---|
| *G02F 1/1337* | (2006.01) | |
| *H05K 1/11* | (2006.01) | |
| *H05K 1/02* | (2006.01) | |
| *G02F 1/1362* | (2006.01) | |
| *H02H 9/00* | (2006.01) | |
| *H02H 9/02* | (2006.01) | |
| *H02H 9/04* | (2006.01) | |
| *H05K 1/18* | (2006.01) | |

(52) U.S. Cl.
CPC ............ *H05K 1/111* (2013.01); *H05K 1/025* (2013.01); *H05K 1/0215* (2013.01); *G02F 1/136227* (2013.01); *G02F 1/136286* (2013.01); *H02H 9/005* (2013.01); *H02H 9/02* (2013.01); *H02H 9/041* (2013.01); *H05K 1/0216* (2013.01); *H05K 1/0259* (2013.01); *H05K 1/189* (2013.01); *Y02P 70/611* (2015.11)

(58) Field of Classification Search
USPC ................................. 361/91.1; 349/43, 132
See application file for complete search history.

(56) References Cited

U.S. PATENT DOCUMENTS

| 8,537,527 B2 * | 9/2013 | Aoyagi ..................... G09G 3/20 174/257 |
|---|---|---|
| 2009/0008131 A1 * | 1/2009 | Shibata ................ H05K 1/0219 174/254 |
| 2009/0167731 A1 * | 7/2009 | Ito ......................... G02F 1/1345 345/204 |
| 2013/0003242 A1 | 1/2013 | Lin et al. |

FOREIGN PATENT DOCUMENTS

| KR | 10-2001-0110158 A | 12/2001 |
| KR | 10-2008-0088317 A | 10/2008 |
| KR | 10-2012-0075114 A | 7/2012 |

* cited by examiner

*Primary Examiner* — Danny Nguyen
(74) *Attorney, Agent, or Firm* — Lee & Morse P.C.

(57) ABSTRACT

A circuit board, including a plurality of wiring lines extending along a first direction and arranged side by side along a second direction perpendicular to the first direction; a plurality of pads having a predetermined length along the first direction, the plurality of pads being on the wiring lines; ground pad outside the pads, the wiring lines including first wiring lines delivering a positive polarity signal and second wiring lines delivering a negative polarity signal, the pads including first pads on the first wiring lines and second pads on the second wiring lines, and a cross-sectional area of each wiring line being substantially equal to that of each pad.

21 Claims, 8 Drawing Sheets

III – III'

PRINTED CIRCUIT BOARD AND DISPLAY DEVICE HAVING THE SAME

CROSS-REFERENCE TO RELATED APPLICATION

Korean Patent Application No. 10-2014-0161647, filed on Nov. 19, 2014, in the Korean Intellectual Property Office, and entitled: "Printed Circuit Board and Display Device Having The Same," is incorporated by reference herein in its entirety.

BACKGROUND

1. Field

Provided is a printed circuit board (PCB) and a display device having the same.

2. Description of the Related Art

Various display devices may be used as portable display devices (such as notebook computers, mobile phones and portable media players (PMPs)), and display devices for homes (such as TVs and monitors). There are various types of display devices such as liquid crystal displays (LCDs), organic light-emitting diode displays (OLED), and electrophoretic displays.

SUMMARY

Embodiments may be realized by providing a circuit board, including a plurality of wiring lines extending along a first direction and arranged side by side along a second direction perpendicular to the first direction; a plurality of pads having a predetermined length along the first direction, the plurality of pads being on the wiring lines; a ground pad outside the pads, the wiring lines including first wiring lines delivering a positive polarity signal and second wiring lines delivering a negative polarity signal, the pads including first pads on the first wiring lines and second pads on the second wiring lines, and a cross-sectional area of each wiring line being substantially equal to that of each pad.

The second pads may be separated from the first pads along the first direction.

The first pads and the second pads may not overlap each other along the second direction.

The circuit board may further include a base having a first surface on which the wiring lines are disposed, and the first wiring lines and the second wiring lines may be arranged alternately.

The first wiring lines may be separated from the second wiring lines along the second direction such that the positive polarity signal and the negative polarity signal maintain an impedance balance.

Adjacent ones of the first wiring lines and second wiring lines may be a group, and the circuit board may further include a ground pattern between neighboring groups and penetrating the base.

The circuit board may further include a ground wiring line connected to the ground pattern, and the ground wiring line may be on a second surface of the base.

The ground wiring line may not overlap the pads along the second direction.

Adjacent ones of the first wiring lines and second wiring lines may be a group, and the circuit board may further include a ground wiring between neighboring groups and extending on the first surface of the base along the first direction.

The base may include a flexible material.

The circuit board may further include an overpower-blocking device including a first electrode connected to each of the pads, a second electrode connected to the ground pad, and a connecting member connecting the first electrode and the second electrode, and the overpower-blocking device may control an overvoltage and an overcurrent received through the wiring lines.

The overvoltage and the overcurrent may be applied to the wiring lines, and the connecting member may discharge the overvoltage and the overcurrent by electrically connecting the first and second pads.

The circuit board may further include an electromagnetic interference (EMI) filter including a first electrode connected to each of the pads, a second electrode connected to the ground pad, and an elimination filter connecting the first electrode and the second electrode, and the EMI filter may remove EMI generated by the wiring lines.

The EMI filter may remove a noise component of the wiring lines and may output the removed noise component to the ground pad.

Embodiments may be realized by providing a display device, including a display panel; and a circuit board on which an integrated circuit for driving the display panel is formed, the circuit board including a plurality of wiring lines extending along a first direction and arranged side by side along a second direction perpendicular to the first direction; a plurality of pads having a predetermined length along the first direction, the plurality of pads being on the wiring lines; a ground pad outside the pads, the wiring lines including first wiring lines delivering a positive polarity signal and second wiring lines delivering a negative polarity signal, the pads including first pads on the first wiring lines and second pads on the second wiring lines, and a cross-sectional area of each wiring line being substantially equal to that of each pad.

The second pads may be separated from the first pads by a predetermined distance along the first direction.

The display device may further include a base having a surface on which the wiring lines may be disposed, and the first wiring lines and the second wiring lines may be arranged alternately.

The first wiring lines may be separated from the second wiring lines along the second direction such that the positive polarity signal and the negative polarity signal maintain an impedance balance.

The display device may further include an overpower-blocking device including a first electrode connected to each of the pads, a second electrode connected to the ground pad, and a connecting member connecting the first electrode and the second electrode, and the overpower-blocking device may control an overvoltage and an overcurrent received through the wiring lines.

The display device may further include an electromagnetic interference (EMI) filter including a first electrode connected to each of the pads, a second electrode connected to the ground pad, and an elimination filter connecting the first electrode and the second electrode, and the EMI filter may remove EMI generated by the wiring lines.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
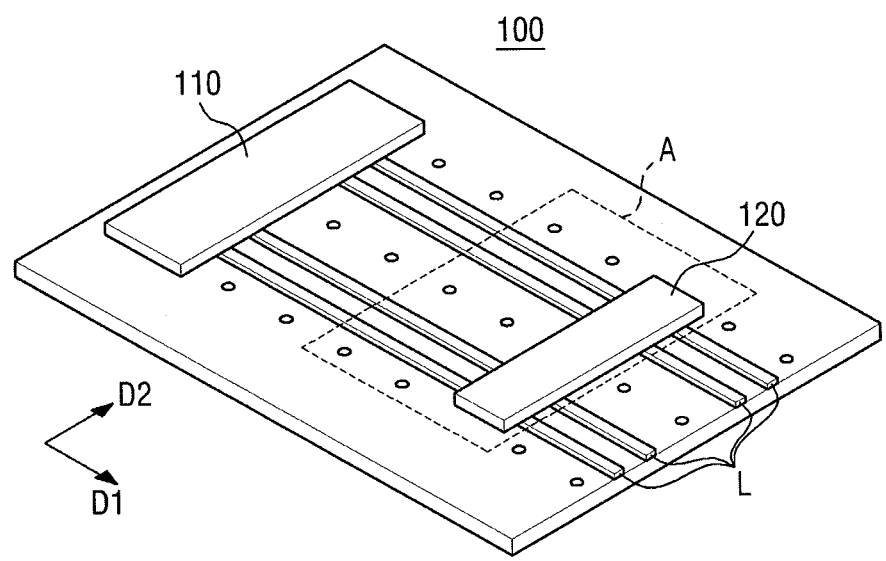
FIG. 1 illustrates a perspective view of a circuit board according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers, regions, and elements may be exaggerated for clarity of illustration. The term "on" that is used to designate that an element is on another element or located on a different layer or a layer includes both a case where an element is located directly on another element or a layer and a case where an element is located on another element via another layer or still another element. Further, it will be understood that when an element is referred to as being "between" other elements, it can be the only element between the two elements, or one or more intervening elements may also be present. In the entire description of the present invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments will be described with reference to the attached drawings.

Figure 2:
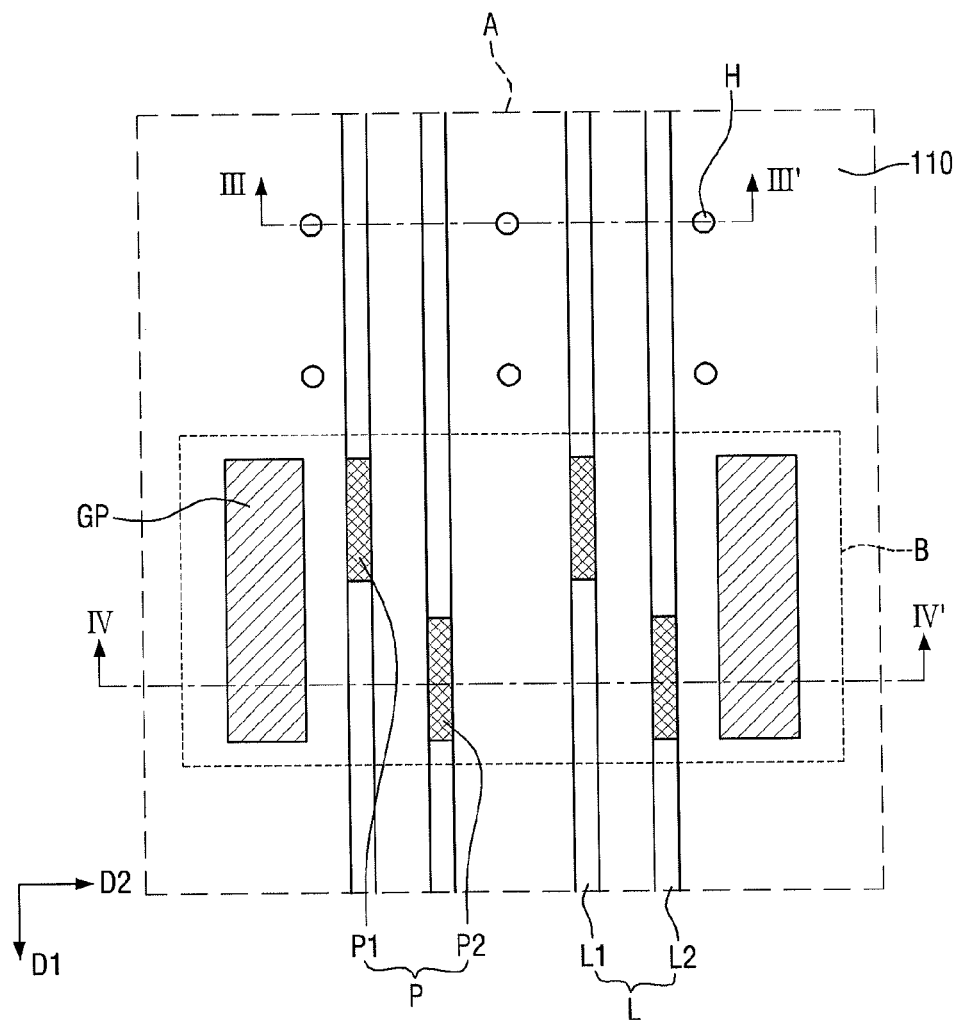
FIG. 2 illustrates an enlarged plan view of a region 'A' of FIG. 1.

FIG. 1 illustrates a perspective view of a circuit board 100 according to an embodiment. FIG. 2 illustrates an enlarged plan view of a region A of FIG. 1. Referring to FIGS. 1 and 2, the circuit board 100 may include a plurality of wiring lines L, a plurality of pads P, and a ground pad GP.

In FIG. 1, one region of the circuit board 100 is shown enlarged. An exemplary configuration of the circuit board 100 is illustrated in FIG. 1. The wiring lines L, the pads P, and the ground pad GP may be disposed on a surface of the circuit board 100. An integrated circuit 110 and an overpower-blocking device 120 may be disposed on the surface of the circuit board 100. The circuit board 100 may be, for example, a control board which drives a display panel, such as, for example, a printed circuit board (PCB). The integrated circuit 110 may be a main processor which generates a driving signal for the display panel. Respective ends of the wiring lines L may be connected to the integrated circuit 110. The driving signal may be delivered to the display panel, for example, via the wiring lines L. The circuit board 100 according to the current embodiment may also be a flexible PCB (FPCB). For example, the circuit board 100 may be a flexible film, and the integrated circuit 110 formed on the surface of the circuit board 100 may be a driver integrated circuit mounted in a chip-on-film (COF) manner. For example, a source signal output from the driver integrated circuit may be delivered to each pixel of the display panel via the wiring lines L.

The wiring lines L may extend along a first direction D1. The wiring lines L may be arranged side by side along a second direction D2 perpendicular to the first direction D1. FIG. 1 illustrates only a specific region of the circuit board 100, and the wiring lines L are straight not all over the circuit board 100. For example, the wiring lines L in other regions of the circuit board 100 not shown in FIG. 1 may be bent in various directions according to their positional relationship with other components.

Four wiring lines L may be provided. For example, the wiring lines L may be four channels. In some embodiments, the wiring lines L may be six channels composed of six wiring lines or eight channels composed of eight wiring lines.

The circuit board 100 may include at least one overpower-blocking device 120. The overpower-blocking device 120 may control an overvoltage and an overcurrent received from a component of the circuit board 100 or an external source via the wiring lines L. The region A in which the overpower-blocking device 120 is disposed may be a region where an overvoltage and an overcurrent are frequently generated. The region A of FIG. 1 may be a region where an overvoltage and an overcurrent are highly likely to be generated. The overpower-blocking device 120 may contact the wiring lines L and discharge a generated overvoltage and overcurrent. The overpower-blocking device 120 may prevent an overvoltage and an overcurrent from flowing to the display panel or to an adjacent integrated circuit 110.

The wiring lines L may contact the overpower-blocking device 120 through the pads P. In FIG. 2, a region B is where the overpower-blocking device 120 is disposed. The overpower-blocking device 120 may be disposed on the pads P and connected to the wiring lines L. Each of the pads P may have a predetermined length along the same direction as the direction in which the wiring lines L extend. As illustrated in FIG. 2, each of the pads P may have a predetermined length along the first direction D1.

The ground pad GP may be formed on the surface of the circuit board 100. The ground pad GP may be disposed outside the pads P. The ground pad GP may contact the overpower-blocking device 120, and an overvoltage and an overcurrent generated by the wiring lines L may be discharged to the ground pad GP via the overpower-blocking device 120.

The wiring lines L may include first wiring lines L1 and second wiring lines L2. The first wiring lines L1 may deliver a positive polarity signal, and the second wiring lines L2 may deliver a negative polarity signal. The first wiring lines L1 and the second wiring lines L2 may be arranged alternately. For example, one first wiring line L1 and one second wiring line L2 may form one group that delivers a differential signal. The integrated circuit 110 may deliver signals using, for example, a mobile industry processor interface (MIPI). The first wiring lines L1 may be separated from the second wiring lines L2 along the second direction D2 such that the positive polarity signal and the negative polarity signal may maintain specific impedance matching. For example, the integrated circuit 110 may output a differential signal generated in view of the impedance balance between the first wiring lines L1 and the second wiring lines L2 to the first wiring lines L1 and the second wiring lines L2. A predetermined impedance value may be in a range of 80 to 120Ω.

First pads P1 having a predetermined length may be disposed on the first wiring lines L1, and second pads P2 having a predetermined length may be disposed on the second wiring lines L2. The predetermined length may be a minimum length needed to connect the pads P and the wiring lines L. A cross-sectional area of each of the second wiring lines L2 may be substantially equal to a cross-sectional area of each of the second pads P2. A cross-sectional area of each of the first wiring lines L1 may be substantially equal to a cross-sectional area of each of the first pads P1. A width of each of the first wiring lines L1 may be substantially equal to a width of each of the first pads P1, and a width of each of the second wiring lines L2 may be substantially equal to a width of each of the second pads P2. For example, a cross-sectional area of each wiring line may be equal to a cross-sectional area of each pad disposed on the wiring line. In an embodiment, a plurality of pads according to the current embodiment may have a minimum length and substantially the same width as wiring lines in order to not affect preset impedance matching of the wiring lines.

The ground pad GP to which an overvoltage and an overcurrent may be discharged through the overpower-blocking device 120 may be formed outside the pads P. For example, the pads P and the ground pad GP for contact with the overpower-blocking device 120 may not cause a substantial change in the direction in which the wiring lines L extend, and preset impedance matching of the wiring lines L may not be changed by the pads required for contact with the overpower-blocking device 120.

The second pads P2 and the first pads P1 may not extend side by side along the second direction D2. The first pads P1 and the second pads P2 may be separated by a predetermined distance along the first direction D1. For example, the first pads P1 and the second pads P2 may not overlap each other along the second direction D2. Each first pad P1 and a second pad P2 neighboring the first pad P1 may be disposed diagonally to each other. For example, the interference between the first and second pads P1 and P2 may be minimized, and the effect of the first and second pads P1 and P2 on impedance matching may be minimized. Further, the gap between the first and second pads P1 and P2 may secure a space through which adhesive resin used to couple the first and second pads P1 and P2 to the overpower-blocking device 120 may slip.

Each component of the circuit board 100 will now be described in greater detail with reference to FIGS. 3 through 5.

Figure 3:
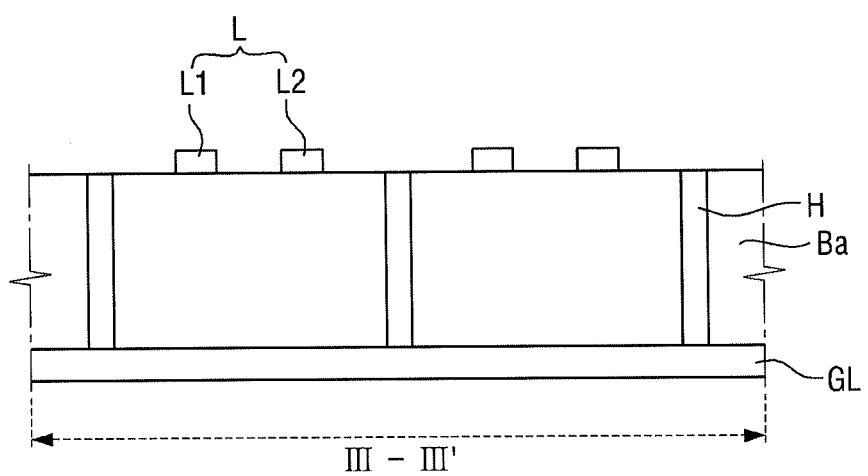
FIG. 3 illustrates a cross-sectional view of the circuit board taken along the line III-III' of FIG. 2.

FIG. 3 illustrates a cross-sectional view of the circuit board 100 taken along the line III-III' of FIG. 2. FIG. 4 illustrates a cross-sectional view of the circuit board 100 taken along the line IV-IV' of FIG. 2. FIG. 5 illustrates a cross-sectional view of the circuit board 100 having the overpower-blocking device 120.

Figure 4:
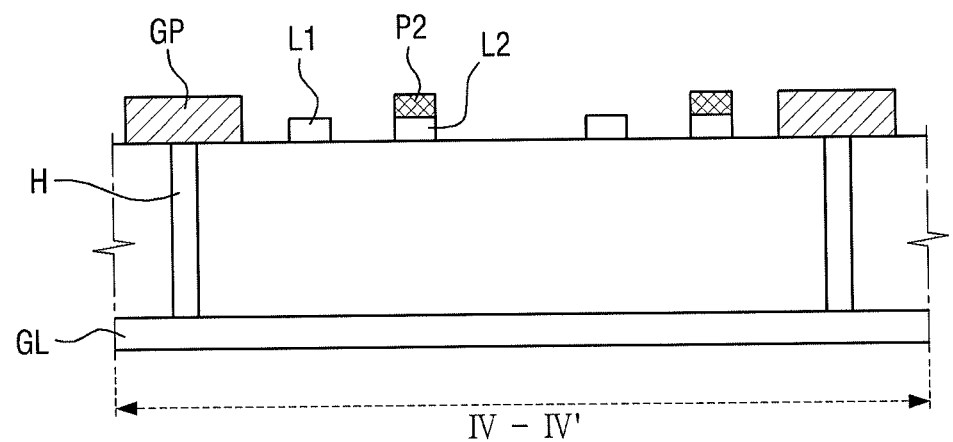
FIG. 4 illustrates a cross-sectional view of the circuit board taken along the line IV-IV' of FIG. 2.
Figure 5:
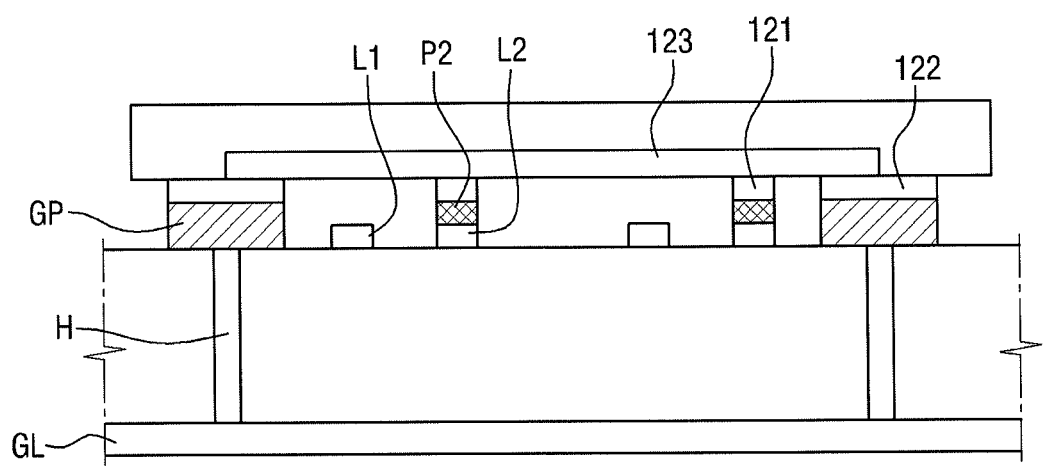
FIG. 5 illustrates a cross-sectional view of the circuit board having an overpower-blocking device.

An exemplary configuration of the circuit board 100 is illustrated in FIGS. 3 through 5. Referring to FIGS. 3 through 5, the circuit board 100 may include a base Ba. The base Ba may be an insulating material. The wiring lines L may be disposed on a first surface of the base Ba, and a ground wiring line GL may be disposed on a second surface of the base Ba. One first wiring line L1 and one second wiring line L2 may form one wiring line group that delivers one differential signal. The circuit board 100 according to the current embodiment may further include a ground pattern H formed on both sides of one wiring line group. For example, the ground pattern H may be disposed between one wiring line group and a neighboring wiring line group. In an embodiment, the ground patterns H may be separated from each other along the first direction D1. The ground patterns H may be made of a conductive material and penetrate the base Ba. The ground patterns H may not be connected to the wiring lines L and may be separated from the wiring lines L. The ground patterns H may be connected to the ground wiring line GL disposed on the second surface of the base Ba. The ground patterns H may discharge static electricity generated instantaneously in the components (including the wiring lines L) of the circuit board 100 and a peripheral portion of the circuit board 100 to the ground wiring line GL. For example, static electricity generated instantaneously may be discharged to the ground wiring line GL via the ground patterns H which are conductive patterns. The ground patterns H may function as an auxiliary to the overpower-blocking device 120 and may protect internal components of the circuit board 100.

The pads P may be disposed on the wiring lines L, and the ground pad GP may be disposed outside the pads P. The ground pad P may be disposed on the first surface of the base Ba and may be connected to the ground wiring line GL disposed on the second surface of the base Ba by a through hole. The through hole may be the ground pattern H described above. For example, the ground pad GP may deliver an overcurrent and an overvoltage discharged from the overpower-blocking device 120 to the ground wiring line GL. The ground pad GP and the pads P may be formed to a predetermined height. A height from the first surface of the base Ba to a top surface of the ground pad GP may be, for example, equal to a height from the first surface of the base Ba to top surfaces of the pads P. As described above, the cross-sectional area of each of the pads P may be substantially equal to that of each of the wiring lines L. However, the cross-sectional area of the ground pad GP may be different from that of each of the pads P. To have sufficient capacity, the ground pad GP may be formed to have a larger cross-sectional area than the pads P. In an exemplary embodiment, the cross-sectional area of the ground pad GP may be, for example, four to five times the cross-sectional area of each of the pads P.

The overpower-blocking device 120 may include a first electrode 121, a second electrode 122, and a connecting member 123. The first electrode 121 may be connected to each of the pads P, and the second electrode 122 may be connected to the ground pad GP. The connecting member 123 may connect the first electrode 121 and the second electrode 122. Each of the first electrode 121 and the second electrode 122 may be a contact electrode. An overvoltage and an overcurrent generated by the wiring lines L may be applied to the connecting member 123 via the first electrode 121. The resistance of the connecting member 123 may vary according to the level of the applied overvoltage and overcurrent. For example, the connecting member 123 may be a varistor. In an embodiment, the resistance of the connecting member 123 may sharply drop in response to an overvoltage exceeding a specific voltage or a surge voltage generated by, e.g., lightening, and an electric current may flow through the connecting member 123. For example, the first electrode 121 and the second electrode 122 may be electrically connected to each other by the connecting member 123 to which an overvoltage and an overcurrent generated by the wiring lines L are applied. The second electrode 122 may be connected to the ground pad GP, and an overvoltage and an overcurrent may be discharged to the ground pad GP. The ground pad GP according to the current embodiment may be disposed outside the wiring lines L, not on a transmission line of the wiring lines GL, and even if the ground pad GP temporarily receives a high voltage, a reduction in impedance uniformity of transmission signals may be minimized.

The circuit board 100 according to the current embodiment may include contact pads which have a minimum length and substantially the same width as wiring lines in order to not affect impedance matching of transmission signals. A ground pad may be disposed outside a transmission line, and the effect of capacitance on impedance may be minimized. For example, the circuit board 100 according to the current embodiment may be connected to the overpower-blocking device 120 while minimizing the effect on impedance matching, and it may be possible to protect other components of the circuit board 100 from overpower and improve the efficiency of signal transmission.

A circuit board according to another embodiment will now be described.

Figure 6:
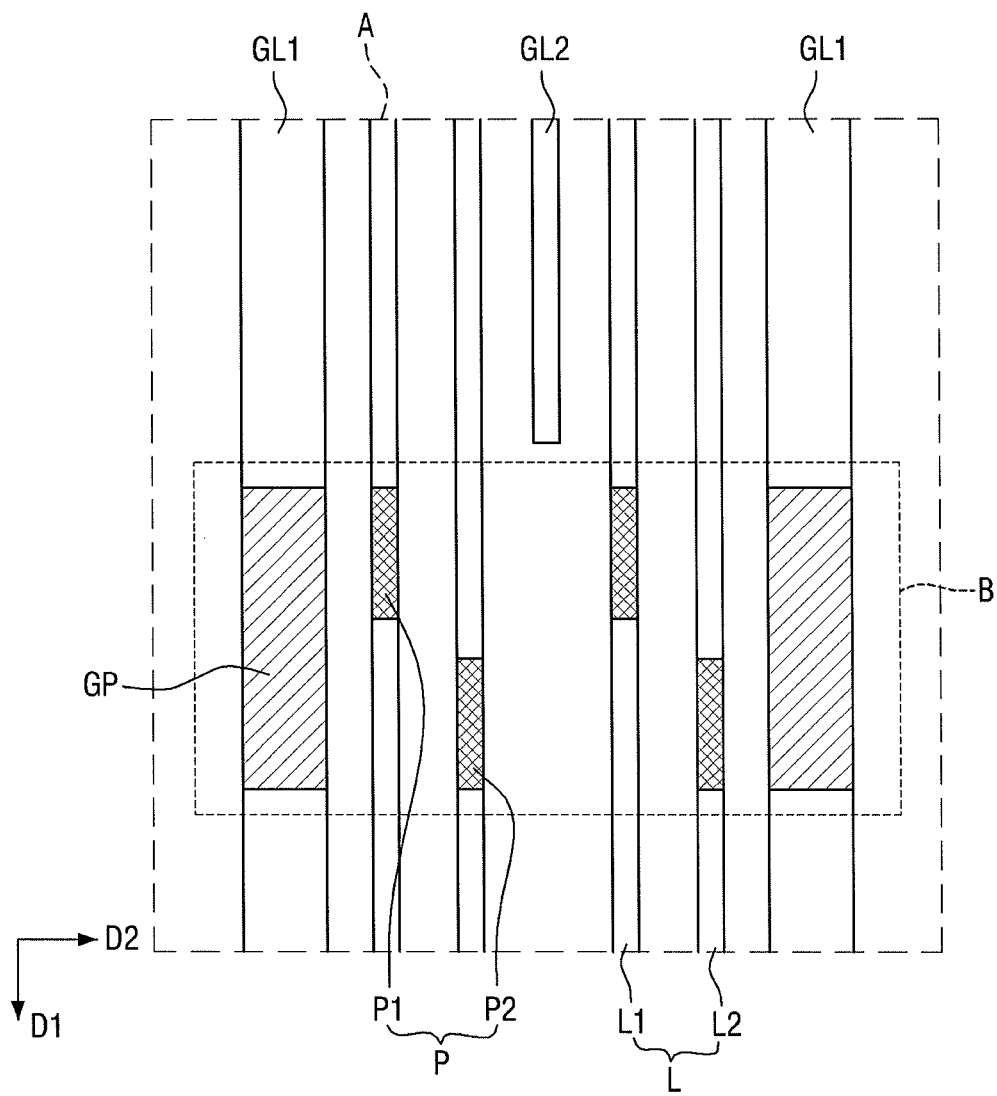
FIG. 6 illustrates an enlarged plan view of a circuit board according to another embodiment.

FIG. 6 illustrates an enlarged plan view of a circuit board 100 according to another embodiment.

Specifically, FIG. 6 is an enlarged plan view of a specific region A in which an overpower-blocking device 120 is disposed in a circuit board 100 according to another embodiment. Referring to FIG. 6, a plurality of ground wiring lines GL and a plurality of wiring lines L according to the current embodiment may be formed on the same surface of the circuit board 100. The ground wiring lines GL may extend along a first direction D1 in which the wiring lines L extend. The ground wiring lines GL may include a first ground wiring line GL1 and a second ground wiring line GL2. The first ground wiring line GL1 may be disposed outside the wiring lines L. Of the wiring lines L, one first wiring lines L1 and one second wiring line L2 may be defined as one group, and the second ground wiring line GL2 may be disposed between one group and a neighboring group. The first ground wiring line GL1 may be connected to a ground pad GP. The second ground wiring line GL2 may not overlap a plurality of pads P along a second direction D2. The ground pad GP according to the current embodiment may be formed outside the wiring lines L, but not between the wiring lines L, and the second ground wiring line GL2 may not extend up to a region where the overpower-blocking device 120 is disposed. The second ground wiring line GL2 may discharge some overcurrent generated between wiring line groups.

Other components of the circuit board 100 according to the current embodiment are substantially identical to those of the circuit board 100 of FIGS. 1 through 5 identified by the same names or reference characters, and a detailed description thereof is omitted.

A Circuit Board According to Another Embodiment Will Now Be Described.

Figure 7:
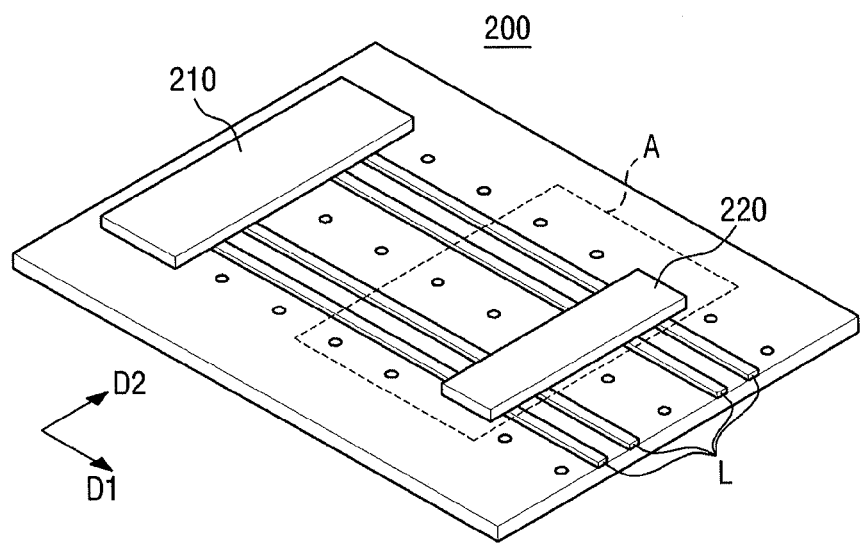
FIG. 7 illustrates a perspective view of a circuit board according to another embodiment.
Figure 8:
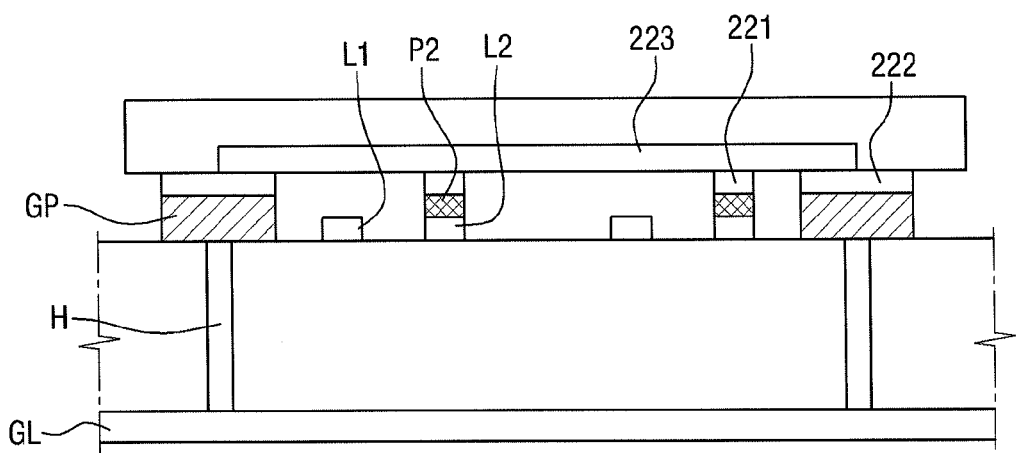
FIG. 8 illustrates a cross-sectional view of a region 'A' of FIG. 7.

FIG. 7 illustrates a perspective view of a circuit board 200 according to another embodiment. FIG. 8 illustrates a cross-sectional view of a region A of FIG. 7. Referring to FIGS. 7 and 8, the circuit board 200 may include an electromagnetic interference (EMI) filter 220. The EMI filter 220 may remove EMI generated by a plurality of wiring lines L. The EMI filter 200 may include a first electrode 221 connected to each of a plurality of pads P, a second electrode 222 connected to a ground pad GP, and an elimination filter 223 which connects the first electrode 221 and the second electrode 222. The elimination filter 223 may eliminate a noise component of a transmission signal received through the first electrode 221. For example, the elimination filter 223 may eliminate the noise component of the wiring lines L. The noise component removed by the elimination filter 223 may be output to the ground pad GP via the second electrode 222. The EMI filter 220 may be mounted on the circuit board 200 in the same form as the overpower-blocking device 120 mounted on the circuit board 100 of FIGS. 1 through 5. For example, the circuit board 200 according to the current embodiment may be connected to the EMI filter 220 while minimizing the effect on impedance matching, and it may be possible to protect other components of the circuit board 200 from noise, for example, due to EMI, and improve the efficiency of signal transmission.

Other components of the circuit board 200 according to the current embodiment are substantially identical to those of the circuit board 100 of FIGS. 1 through 5 identified by the same names or reference characters, and a detailed description thereof is omitted.

A display device according to an embodiment will now be described.

Figure 9:
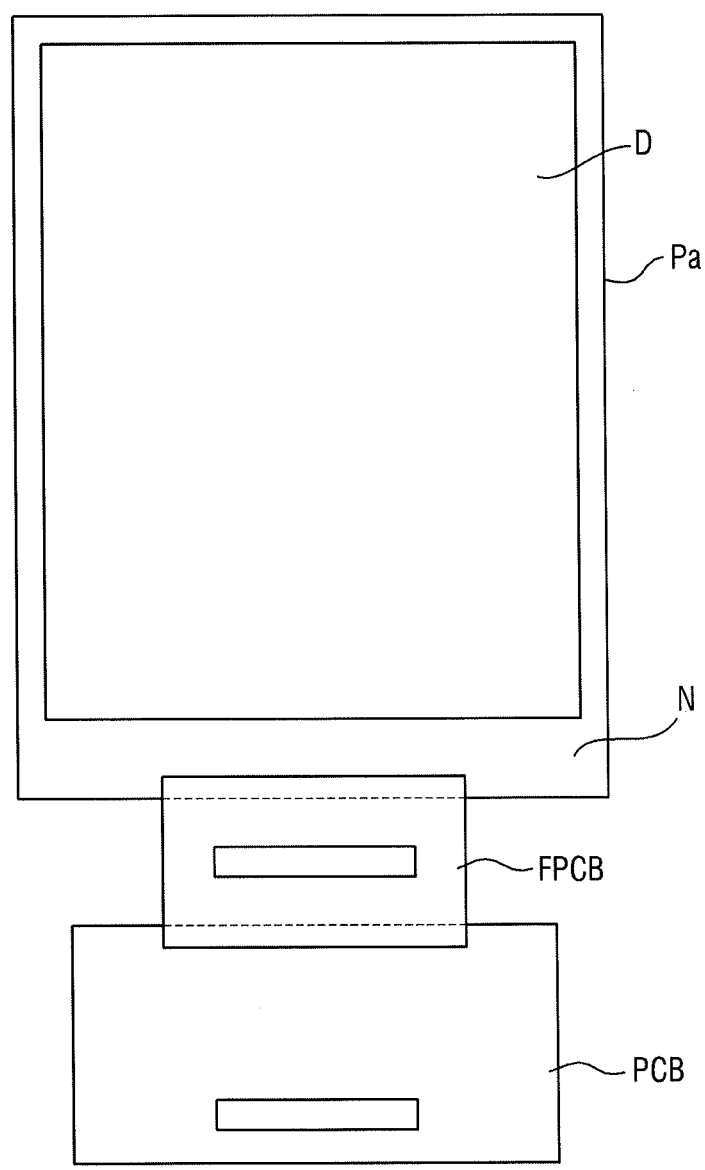
FIG. 9 illustrates a schematic plan view of a display device according to an embodiment.

FIG. 9 illustrates a schematic plan view of a display device 10 according to an embodiment. Referring to FIG. 9, the display device 10 according to the current embodiment includes a display panel Pa and a circuit board. The display panel Pa may be a panel that displays an image. The display panel Pa that displays an image may be a liquid crystal display (LCD) panel, an electrophoretic display panel, an organic light-emitting diode (OLED) panel, a light-emitting diode (LED) panel, an inorganic electroluminescent (EL) display panel, a field emission display (FED) panel, a surface-conduction electron-emitter display (SED) panel, a plasma display panel (PDP), or a cathode ray tube (CRT) display panel. In an embodiment, the display panel Pa may be rectangular. In some embodiments, the display panel Pa may not be rectangular and may include a circular display area.

The display panel Pa may include a display area D in which a plurality of display elements are disposed to display an image and a non-display area N which is formed around the display area D. The display area D may display an image according to a data signal received from an external source and may include a plurality of pixels arranged in a matrix. The non-display area N may surround the display area D. Various circuits and wiring lines for supplying an image signal to each display element of the display area D may be disposed in the non-display area N. For example, the non-display area N may be an area to which the circuit board is connected.

The circuit board may be connected to the non-display area N of the display panel Pa and supply a driving signal to each display element of the display area D. The circuit board may include a PCB which is a control board for driving the display panel Pa and an FPCB which connects the PCB and the display panel Pa. The circuit board may be one of the circuit boards of FIGS. 1 through 8. For example, the circuit board may include a plurality of wiring lines L which extend along a first direction D1 and are arranged along a second direction D2 perpendicular to the first direction D1, a plurality of pads P which have a predetermined length along the first direction D1 and are disposed on the wiring lines L, and a ground pad GP which is disposed outside the pads P. The wiring lines L include first wiring lines L1 which deliver a positive polarity signal and second wiring lines L2 which deliver a negative polarity signal. The pads P include first pads P1 disposed on the first wiring lines L1 and second pads P2 disposed on the second wiring lines L2. A cross-sectional area of each wiring line may be substantially equal to that of each pad.

The first wiring lines L1 and the second wiring lines L2 may be arranged alternately. The first wiring lines L1 may be separated from the second wiring lines L2 along the second direction D2 such that the positive polarity signal and the negative polarity signal maintain an impedance balance. The pads P may have a minimum length and substantially the same width as the wiring lines L in order to not affect preset impedance matching of the wiring lines L. The ground pad GP may be disposed outside the wiring lines L, not on a transmission line of the wiring lines GL, and even if the ground pad GP temporarily receives a high voltage, a reduction in impedance uniformity of transmission signals may be minimized.

The second pads P2 and the first pads P1 may not be arranged side by side along the second direction D2. The first pads P1 and the second pads P2 may be separated by a predetermined distance along the first direction D1. For example, the first pads P1 and the second pads P2 may not overlap each other along the second direction D2. Each first pad P1 and a second pad P2 neighboring the first pad P1 may be disposed diagonally to each other. For example, the interference between the first and second pads P1 and P2 may be minimized, and the effect of the first and second pads P1 and P2 on impedance matching may be minimized. Further, the gap between the first and second pads P1 and P2 may secure a space through which adhesive resin used to couple the first and second pads P1 and P2 to the overpower-blocking device 120 may slip.

The circuit board may further include an overpower-blocking device which includes a first electrode connected to each of the pads P, a second electrode connected to the ground pad P and a connecting member connecting the first electrode and the second electrode and controls an overvoltage and an overcurrent received through the wiring lines L. Accordingly, the display device 10 according to the current embodiment may prevent damage to the circuit board and the display panel Pa, for example, due to overpower, without affecting impedance of the transmission line, and the efficiency of signal transmission may be improved.

In some embodiments, the circuit board may further include an EMI filter which includes a first electrode connected to each of the pads P, a second electrode connected to the ground pad GP and an elimination filter connecting the first electrode and the second electrode and eliminates EMI generated by the wiring lines L. Accordingly, the display device 10 may remove noise, for example, due to EMI, without affecting impedance of the transmission line, and the efficiency of signal transmission may be further improved.

By way of summation and review, various display devices are becoming lighter and thinner.

In a display device, a driving signal for driving the display device may be provided to a panel via a control board which is a printed circuit board (PCB). Electrical connection between the control board and the panel may be achieved by a flexible PCB (FPCB).

During the operation of the display device, a surge voltage such as electrostatic discharge (ESD) may be generated not only in the PCB but also in the FPCB. Electromagnetic interference (EMI) may be generated. The overvoltage may damage a driver integrated circuit formed on the PCB or the FPCB, and the EMI may cause crosstalk between signals. As a result, the function of the display device may be degraded.

Embodiments provide a printed circuit board (PCB) which may prevent a malfunction by suppressing the generation of electrostatic discharge (ESD) and electromagnetic interference (EMI). Embodiments also provide a display device having a PCB which may prevent a malfunction by suppressing the generation of ESD and EMI.

Embodiments may remove generated electrostatic discharge (ESD) and EMI. Embodiments may maintain an impedance balance, and the efficiency of signal transmission may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A circuit board, comprising:
    a plurality of wiring lines extending along a first direction and arranged side by side along a second direction perpendicular to the first direction;
    a plurality of pads having a predetermined length along the first direction, the plurality of pads being on the wiring lines;
    a ground pad outside the pads,
    the wiring lines including a first wiring line delivering a positive polarity signal and a second wiring line delivering a negative polarity signal, the pads including a first pad on the first wiring line and a second pads on the second wiring line, wherein:
    a width of the first wiring line is substantially equal to that of the first pad, and
    a width of the second wiring line is substantially equal to that of the second pad.

2. The circuit board as claimed in claim 1, wherein the second pad is separated from the first pad along the first direction.

3. The circuit board as claimed in claim 1, wherein the first pad and the second pad do not overlap each other along the second direction.

4. The circuit board as claimed in claim 1, further comprising a base having a first surface on which the wiring lines are disposed, wherein
    the first wiring line and the second wiring line are arranged alternately, and wherein:
    the first wiring line is between the first pad and the base, and
    the second wiring line is between the second pad and the base.

5. The circuit board as claimed in claim 4, wherein the first wiring line is separated from the second wiring line along the second direction such that the positive polarity signal and the negative polarity signal maintain an impedance balance.

6. The circuit board as claimed in claim 4, wherein the first wiring line and second wiring line are a group, the circuit board further including a ground pattern between neighboring groups and penetrating the base.

7. The circuit board as claimed in claim 6, further comprising a ground wiring line connected to the ground pattern, the ground wiring line being on a second surface of the base.

8. The circuit board as claimed in claim 7, wherein the ground wiring line does not overlap the pads along the second direction.

9. The circuit board as claimed in claim 4, wherein the first wiring line and second wiring line are a group, the circuit board further including a ground wiring between neighboring groups and extending on the first surface of the base along the first direction.

10. The circuit board as claimed in claim 4, wherein the base includes a flexible material.

11. The circuit board as claimed in claim 1, further comprising an overpower-blocking device including a first electrode connected to each of the pads, a second electrode connected to the ground pad, and a connecting member connecting the first electrode and the second electrode, the overpower-blocking device controlling an overvoltage and an overcurrent received through the wiring lines.

12. The circuit board as claimed in claim 11, wherein when the overvoltage and the overcurrent are applied to the wiring lines, the connecting member discharges the overvoltage and the overcurrent by electrically connecting the first and second pads.

13. The circuit board as claimed in claim 1, further comprising an electromagnetic interference (EMI) filter including a first electrode connected to each of the pads, a second electrode connected to the ground pad, and an elimination filter connecting the first electrode and the second electrode, the EMI filter removing EMI generated by the wiring lines.

14. The circuit board as claimed in claim 13, wherein the EMI filter removes a noise component of the wiring lines and outputs the removed noise component to the ground pad.

15. A display device, comprising:
a display panel; and
a circuit board on which an integrated circuit for driving the display panel is formed,
the circuit board including:
a plurality of wiring lines extending along a first direction and arranged side by side along a second direction perpendicular to the first direction;
a plurality of pads having a predetermined length along the first direction, the plurality of pads being on the wiring lines;
a ground pad outside the pads,
the wiring lines including a first wiring line delivering a positive polarity signal and a second wiring line delivering a negative polarity signal, the pads including a first pad on the first wiring line and a second pad on the second wiring line, wherein:
a width of the first wiring line is substantially equal to that of the first pad, and
a width of the second wiring line is substantially equal to that of the second pad.

16. The display device as claimed in claim 15, wherein the second pad is separated from the first pad by a predetermined distance along the first direction.

17. The display device as claimed in claim 15, further comprising a base having a surface on which the wiring lines are disposed, wherein
the first wiring line and the second wiring line are arranged alternately, and wherein:
the first wiring line is between the first pad and the base, and
the second wiring line is between the second pad and the base.

18. The display device as claimed in claim 17, wherein the first wiring line is separated from the second wiring line along the second direction such that the positive polarity signal and the negative polarity signal maintain an impedance balance.

19. The display device as claimed in claim 15, further comprising an overpower-blocking device including a first electrode connected to each of the pads, a second electrode connected to the ground pad, and a connecting member connecting the first electrode and the second electrode, the overpower-blocking device controlling an overvoltage and an overcurrent received through the wiring lines.

20. The display device as claimed in claim 15, further comprising an electromagnetic interference (EMI) filter including a first electrode connected to each of the pads, a second electrode connected to the ground pad, and an elimination filter connecting the first electrode and the second electrode, the EMI filter removing EMI generated by the wiring lines.

21. The circuit board as claimed in claim 1, wherein:
a cross-sectional area of the first wiring line is substantially equal to that of the first pad, and
a cross-sectional area of the second wiring line is substantially equal to that of the second pad.

* * * * *